(12) United States Patent
Nowak-Leijten

(10) Patent No.: US 7,196,541 B2
(45) Date of Patent: *Mar. 27, 2007

(54) ELECTRONIC CIRCUIT WITH ARRAY OF PROGRAMMABLE LOGIC CELLS

(75) Inventor: Katarzyna Nowak-Leijten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/545,641

(22) PCT Filed: Feb. 12, 2004

(86) PCT No.: PCT/IB2004/050109

§ 371 (c)(1),
(2), (4) Date: Aug. 16, 2005

(87) PCT Pub. No.: WO2004/075409

PCT Pub. Date: Sep. 2, 2004

(65) Prior Publication Data

US 2006/0164119 A1    Jul. 27, 2006

(30) Foreign Application Priority Data

Feb. 19, 2003  (EP) .................................. 03100389

(51) Int. Cl.
*H03K 19/173*  (2006.01)

(52) U.S. Cl. ............................. 326/38; 326/40; 326/41; 326/47; 708/232; 708/235

(58) Field of Classification Search ............ 326/37–41, 326/47; 708/230, 232, 235
See application file for complete search history.

(56) References Cited

U.S. PATENT DOCUMENTS

| | | | | |
|---|---|---|---|---|
| 5,570,039 A * | 10/1996 | Oswald et al. ................. | 326/39 |
| 5,761,099 A * | 6/1998 | Pedersen ..................... | 708/230 |
| 6,157,212 A * | 12/2000 | Lane ........................... | 326/40 |
| 6,271,680 B1 * | 8/2001 | Mendel et al. ................. | 326/40 |
| 6,288,570 B1 * | 9/2001 | New ........................... | 326/41 |
| 2003/0055852 A1 * | 3/2003 | Wojko ........................ | 708/230 |
| 2006/0066345 A1 * | 3/2006 | Leijten-Nowak ............... | 326/6 |
| 2006/0097750 A1 * | 5/2006 | Leijten-Nowak ............. | 326/39 |

* cited by examiner

*Primary Examiner*—Rexford Barnie
*Assistant Examiner*—Jason Crawford

(57) ABSTRACT

An electronic circuit has a programmable logic cell with a plurality of programmable logic units that are capable of being configured to operate in a multi-bit operand mode and a random logic mode. The programmable logic units are coupled in parallel between an input circuit and an output circuit. The input circuit can be configured to supply logic input signals from the same combination of the logic inputs to the programmable logic units in the random logic mode. In the multi-bit operand processing mode the input circuit is configured to supply logic input signals from different ones of the logic inputs to the programmable logic units. The programmable logic units are coupled to successive positions along a carry chain at least in the multi-bit operand mode, so as to process carry signals from the carry chain. The output circuit selects an output signal from the programmable logic units under control of further input signals in the random logic mode and passes outputs from the programmable logic units in parallel in the multi-bit operand mode. The programmable logic units comprise a multiplexer for passing one of the received input signals when configured to operate in the multiplexing mode of operation. Control signals may be shared between the multiplexing mode and the multi-bit operand processing mode.

21 Claims, 12 Drawing Sheets

| Mode | Z (SUB) | Y (MUL) | X (Cin) |
|---|---|---|---|
| Random logic | 0 | 1 | - |
| Addition (ext) | 0 | 1 | C0 |
| Addition (int) | 0 | 1 | 0 |
| Subtraction (ext) | 1 | 1 | C0 |
| Subtraction (int) | 1 | 1 | 1 |
| Addition/Subtraction (ext) | C2 | 1 | C0 |
| Addition/Subtraction (int) | C2 | 1 | 1/0 |
| Multiplication (ext) | 0 | C1 | C0 |
| Multiplication (ext) | 0 | C1 | 0 |
| Multiplexing | C2 | C1 | C0 |

ELECTRONIC CIRCUIT WITH ARRAY OF PROGRAMMABLE LOGIC CELLS

CONTINUING DATA OF THE APPLICATION

This application is a 371 of PCT/IB04/50109 filed on Feb. 12, 2004.

The invention relates to an electronic circuit with an array of programmable logic cells, and in particular, to an electronic circuit with an array of programmable logic cells that is configurable to provide flexible multiplexing.

Programmable logic cells enable circuit designers to adapt the logic function of individual instances of electronic circuits that have been mass-produced, such as integrated circuits. This reduces the time interval from design to production of a working circuit and it reduces manufacturing cost for production of small batches of products and for prototyping.

In one example of an implementation, a programmable cell contains a memory that is addressed by the input signal of the cell, the memory storing pre-programmed output signals for each combination of input signal values at the respective addresses that are addressed by these values. The memory is said to have a LUT (Look-Up Table) function, for looking up the output signals that are produced in response to various input signals.

Any logic function can be implemented with a LUT, provided that it contains sufficient memory space. In practice, however, only logic functions that require a limited number of inputs, typically no more than four, are implemented with LUTs in circuits with programmable logic cells. Such a LUT requires 16 memory locations. This permits the programming of random logic functions of four input bits. In many cases circuits with such cells with four input bit functions suffice. A circuit with an array of such cells, in which the outputs of cells are coupled to the inputs of other cells, permits the designer to implement more complicated logic functions.

Increasingly designers are implementing logic functions for which a part of the array of programmable logic cells is used to implement signal-processing operations such as additions. Many signal processing operations have the property that many bits of a wider input operand each can influence many bits in an output result, through carry effects. However, very inefficient implementations are obtained when such a wide dependency is implemented using 4 bit input LUTs.

Xilinx™ has addressed this problem in its Virtex™ family of programmable logic devices by adding a carry chain to an array of 4 bit input LUT cells. FIG. 1 shows a programmable logic cell of such a device. The cell contains a four input lookup table 10 that performs the LUT function and a carry circuit 12 with a carry input and a carry output. The output of memory 10 is coupled to the carry circuit 12, which combines the carry input signal with the output signal of the LUT to form the carry output signal. An exclusive OR gate 14 is used to form the output signal of the cell from the carry input signal and output signal of the LUT. The carry input and carry output of the cell are coupled to the carry output and the carry input of adjacent cells in the array (not shown) to form a carry chain. The carry chain performs the carry function from the output of one 4 bit input LUT to another. As a result no LUTs need to be allocated to implement carry functions. This saves a considerable number of LUTs when the circuit is used to implement logic functions that include some signal processing operations.

Nevertheless, compared to dedicated signal processing circuitry, the implementation of signal processing functions in such a more general purpose circuit that is also capable of implementing random logic functions is still far less efficient. It would be desirable if this efficiency could be improved.

Among others, it is an object of the invention to provide an electronic circuit with an array of programmable logic cells that permit the implementation of a more flexible multiplexing capability, and which provide both random logic functions and signal processing operations.

The electronic circuit according to the invention is set forth in Claim 1. The electronic circuit contains a programmable logic cell with a plurality of programmable logic units that are coupled in parallel between signal inputs and outputs of the cell. The programmable logic cell is configurable to operate in a random logic mode and in a multi-bit operand mode, with the programmable logic cells comprising a configurable look-up table circuit, having inputs coupled to receive the logic input signals from the input circuit and having an output, a controllable inverter/non-inverter circuit, having an input coupled to receive the output of the look-up table circuit, the output of the inverter/non-inverter circuit being connectable to the output circuit, and a multiplexer, having inputs coupled to receive the logic input signals from the input circuit, and having a multiplexer output connectable to the output circuit.

This arrangement provides a programmable logic cell that has an improved multiplexing capability. Furthermore, silicon area is reduced and timing improved.

In an embodiment, the programmable logic unit further comprises an auxiliary multiplexer having inputs coupled to receive the output of the inverter/non-inverter circuit and the output of the multiplexer. In this embodiment the programmable logic unit has a single output from the auxiliary multiplexer.

In a further embodiment, the programmable logic unit comprises first and second auxiliary multiplexers. The first auxiliary multiplexer has inputs coupled to receive the output of the inverter/non-inverter circuit and the output of the multiplexer, while the second auxiliary multiplexer has inputs coupled to receive the output of the look-up table circuit and the output of the multiplexer. The first and second multiplexers are controlled by configuration information from a configuration memory, such that datapath and random logic output signals are output from the first and second auxiliary multiplexers respectively in a first mode, and a multiplexer output signal is output from the first and second multiplexers in a second mode.

In a further embodiment, at least one control line used in the random logic or multiplexing modes is shared with a control line used in the datapath mode. This has the advantage of reducing the number of input pins required.

The invention provides an electronic circuit with an array of programmable logic cells that permit the implementation of a more flexible multiplexing capability, and which provide both random logic functions and signal processing operations.

These and other objects and advantageous aspects of the invention will be described using the following Figures.

Figure 1:
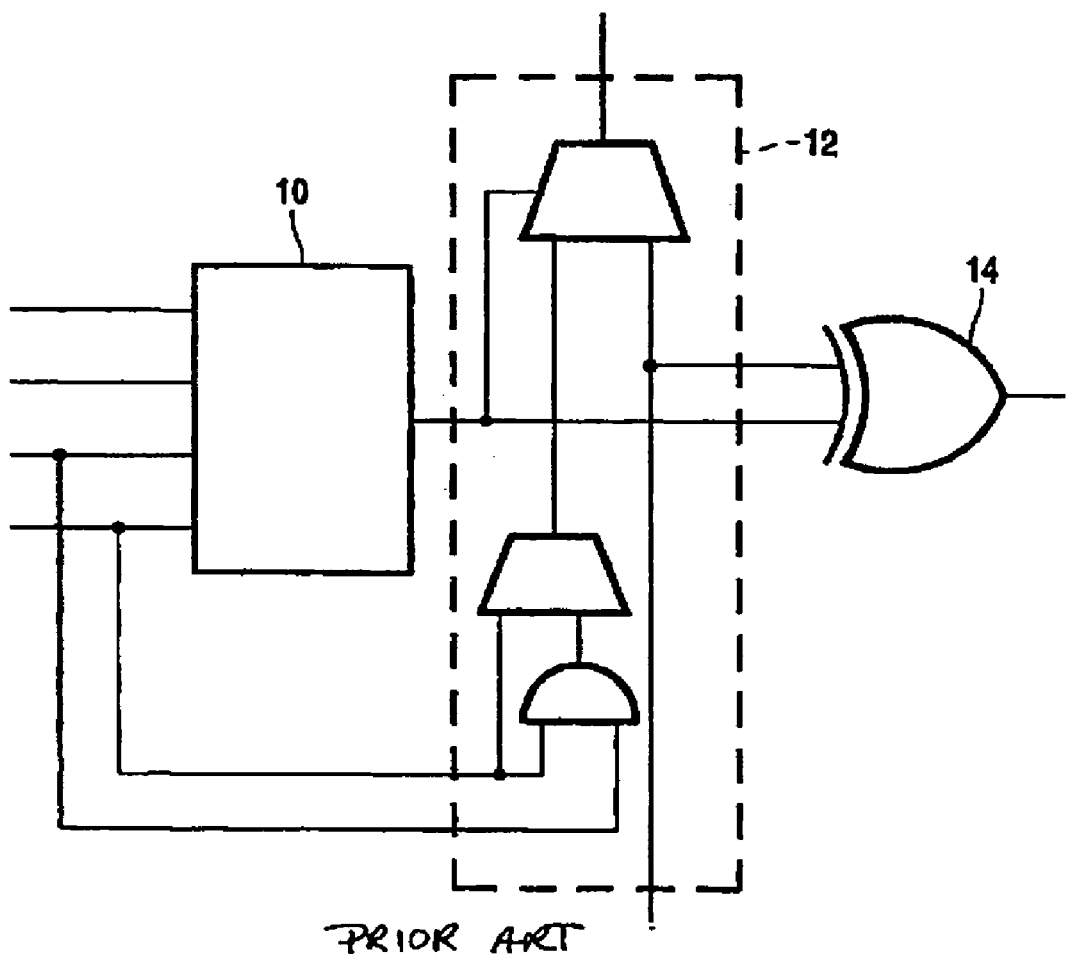
FIG. 1 shows a prior art programmable logic cell.
Figure 2:
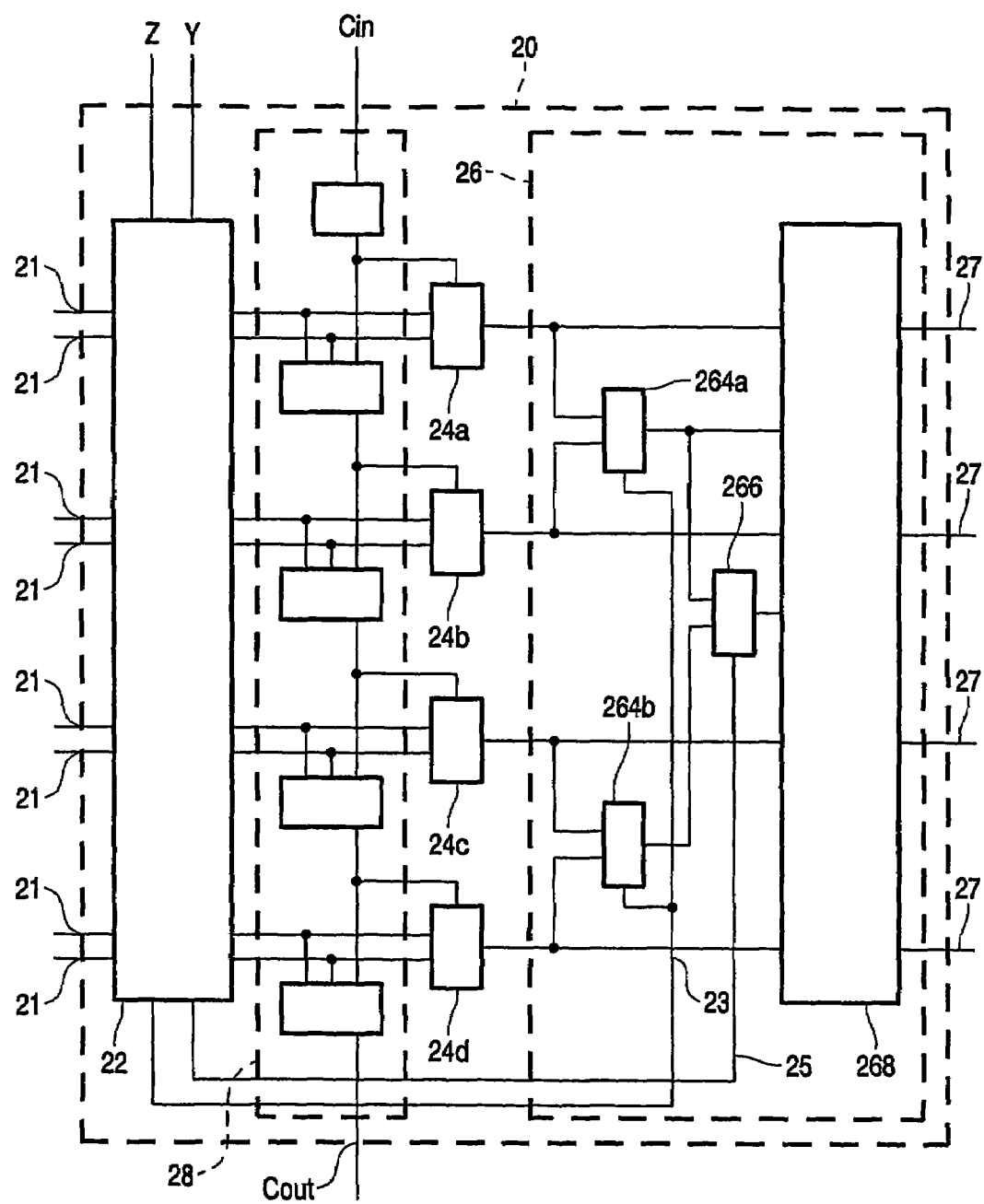
FIG. 2 shows a programmable logic cell which is configurable to function in a multiplexing mode, a random logic mode and in a multi-bit operand processing mode.

FIG. 2 shows a programmable logic cell 20 having an architecture which enables designers to implement a multiplexing mode, a random logic mode or multi-bit operand processing mode. Cell 20 contains an input circuit 22, a plurality of programmable logic units 24a–d, an output circuit 26 and a carry chain 28. Signal inputs 21 and signal outputs 27 of the cell 20 are coupled via a cascade of input circuit 22, a parallel arrangement of programmable logic units 24a–d and output circuit 26. Carry chain 28 has a carry input Cin and a carry output Cout and is coupled to the programmable logic units at a series of positions along the chain.

Output circuit 26 contains a number of stages of multiplexers 264a, 264b, 266 and a switching stage 268. Control inputs 23 of the multiplexers 264a, 264b in the first stage are coupled to a respective output of the input circuit 22. Control input 25 of the multiplexer 266 in the second stage is coupled to a respective output of the input circuit 22. Signal inputs of the multiplexers 264a, 264b of a first stage are coupled to the outputs of pairs of programmable logic units 24a–d, and signal inputs of the multiplexer 266 at the second stage are coupled to the outputs of the multiplexers 264a, 264b of the first stage. It is noted that although multiplexers 264a and 264b are shown as having a common control input 23, the circuit may also be configured to provide separate control signals 23a, 23b. In addition, it will be appreciated that, although FIG. 2 shows only two stages of multiplexers 264a/264b and 266, further stages are possible, for example if the logic cell contains more than four logic cells 24a–d.

The outputs of the programmable logic units 24a–d and the multiplexer 266 of the second stage are coupled to inputs of the switching stage 268. Outputs of switching stage 268 are coupled to signal outputs 27 of cell 20. Switching stage 268 is configurable to couple either the outputs of the programmable logic units 24a–d to outputs 27 or the outputs of the multiplexers 264a, 264b, 266 of the first and second stage to outputs 27, or at least the output of multiplexer 266 of the second stage. Switching stage 268 may be provided with latches or flip-flops for latching the output signal, so that cell 20 can function as a final part of a pipelined stage in a pipelined circuit Preferably, switching stage 268 is configurable to pass signals either after latching or without latching.

By programming configuration bits of programmable logic units 24a–d, input circuit 22, output circuit 26 and carry chain 28, the function of cell 20 can be configured. (The configuration bits are stored in configuration memories (not shown) which are loaded via a programming path (not shown), both of which are known per se for programmable logic devices). The configuration bits determine which of signal inputs 21 are coupled to which of programmable logic units 24a–d, the configuration bits determine which output signal values the programmable logic units 24a–d will produce in response to various input signal values, the configuration bits determine which signals switching stage 268 will pass to signal output 27 and the configuration bits determine whether a carry input signal from carry input Cin will be passed into cell 20.

In operation cell 20 can be configured to function in a random logic mode, a multi-bit operand processing mode and in a multiplexing mode. In operation, the multi-bit operand mode cell 20 outputs a plurality of bits of an output result that depends on input operands with a plurality of bits. The bits in each input operand have successively higher significance levels. In the multi-bit operand mode each programmable logic unit 24a–d is associated with a different significance level. The input circuit 22 is configured to pass signals to each programmable logic unit 24a–d that represent the bits from different operands, each bit corresponding to the significance level that is associated with the programmable logic unit 24a–d. Each programmable logic unit 24a–d responds to these signals by computing the bit of the result at the significance level that is associated with the programmable logic unit 24a–d, taking account of a carry in signal that is received from carry chain 28 from a lower significance level and supplying a carry out to the carry chain for use at a higher significance level. In the multi-bit operand mode, all programmable logic units 24a–d will generally be configured to provide the same relation between their input signals and output signals. Output circuit 26 is configured to pass the computed bits of the result from all of the programmable logic units 24a–d in parallel as output signals to output 27.

Carry chain 28 computes carry signals and passes these carry signals from one programmable logic unit 24a–d to another. The configuration of carry chain 28 controls whether carry chain 28 uses a carry input signal from carry input Cin to determine the carry signals. If cell 20 processes input signals that are more significant bits of a larger operand, the cell is configured so that such a carry input signal is used to receive a carry output signal of another cell that processes less significant operands.

In operation in the random logic mode the output signal of cell 20 is a random logic function of a number of input signals. This random logic function is implemented using programmable logic units 24a–d and the first and second stages of multiplexers 264a, 264b, 266. Input circuit 22 passes the same input signals to each of the programmable functional units 24a–d. Under control of other ones of the input signals which form first and second control signals 23, 25, the multiplexers 264a, 264b, 266 select one of the programmable logic units 24a–d from which the output signal is passed to switching stage 268. The first control signal 23 controls both multiplexers 264a, 264b in the first stage, while the second control signal 25 controls multiplexer 266 in the second stage, which selects between the outputs of multiplexers 264a, 264b in the first stage. Thus, a logic function is realized that depends both on the input signals of the programmable logic units 24a–d and on the other ones of the input signals, i.e. the control signals 23, 25 that control multiplexers 264a, 264b, 266. Each of the programmable functional units 24a–d produces an output signal in response to the same input signals, each for use as output signal for a different value of the other ones of the input signals forming the control signals 23, 25. Switching stage 268 passes the resulting output signal from multiplexer 266 to the signal output of cell 20.

Carry chain 28 is configured so that no external carry input signal is used in the random logic mode. Dependent on the implementation of carry chain 28, carry chain 28 may still pass some carry signals, which arise at certain input values of the inputs to programmable logic units 24a–d. In this case, the configuration of programmable logic units 24a–d further down the carry chain may be adapted to account for the presence of carry signals for specific values of the input values. Alternatively, the programmable logic units 24a–d may comprise circuitry for removing the dependency on the carry signal when configured to operate in the random logic mode. Further details of the carry chain are provided later in the description.

Thus, there is a contrast between the random logic mode and the multi-bit operand mode. On one hand, in the random logic mode, each programmable logic unit 24a–d receives the same input signals and each provides a potentially different input-output function for a different value of the other ones of the input signals that control the multiplexing stages 264a, 264b, 266. On the other hand, in the multi-bit operand mode, the programmable logic units 24a–d receive different input signals, but generally provide the same input-output function.

By using the programmable logic units alternatively on one hand for implementing computation of different significance levels of a two multi-bit operand signal processing operation and on the other hand as part of a structure for computing a more than two bit-input random logic function, the number of configuration bits that is needed to support implementation of both random logic functions and multi-bit operand signal processing is minimized. In the example of FIG. 2, with four two input programmable logic units 24a–d, which are fully programmable with four configuration bits each, sixteen bits suffice to define any four bit-input random logic function and at the same time four significance levels of any two-operand signal processing operation. In contrast, consider the situation where 4-bit input programmable logic units 24a–d would have been used (each of which requires 16 configuration bits for full programming). When using 4-input logic units instead of 2-input logic units, two significance levels of multi-bit operand processing can be implemented if no dedicated carry signal is present, or four significance levels if such circuitry is present. In both cases, however, four 4-input logic units will require 64 configuration bits in total, i.e. four times the number of configuration bits required by the embodiment of FIG. 2.

Figure 3:
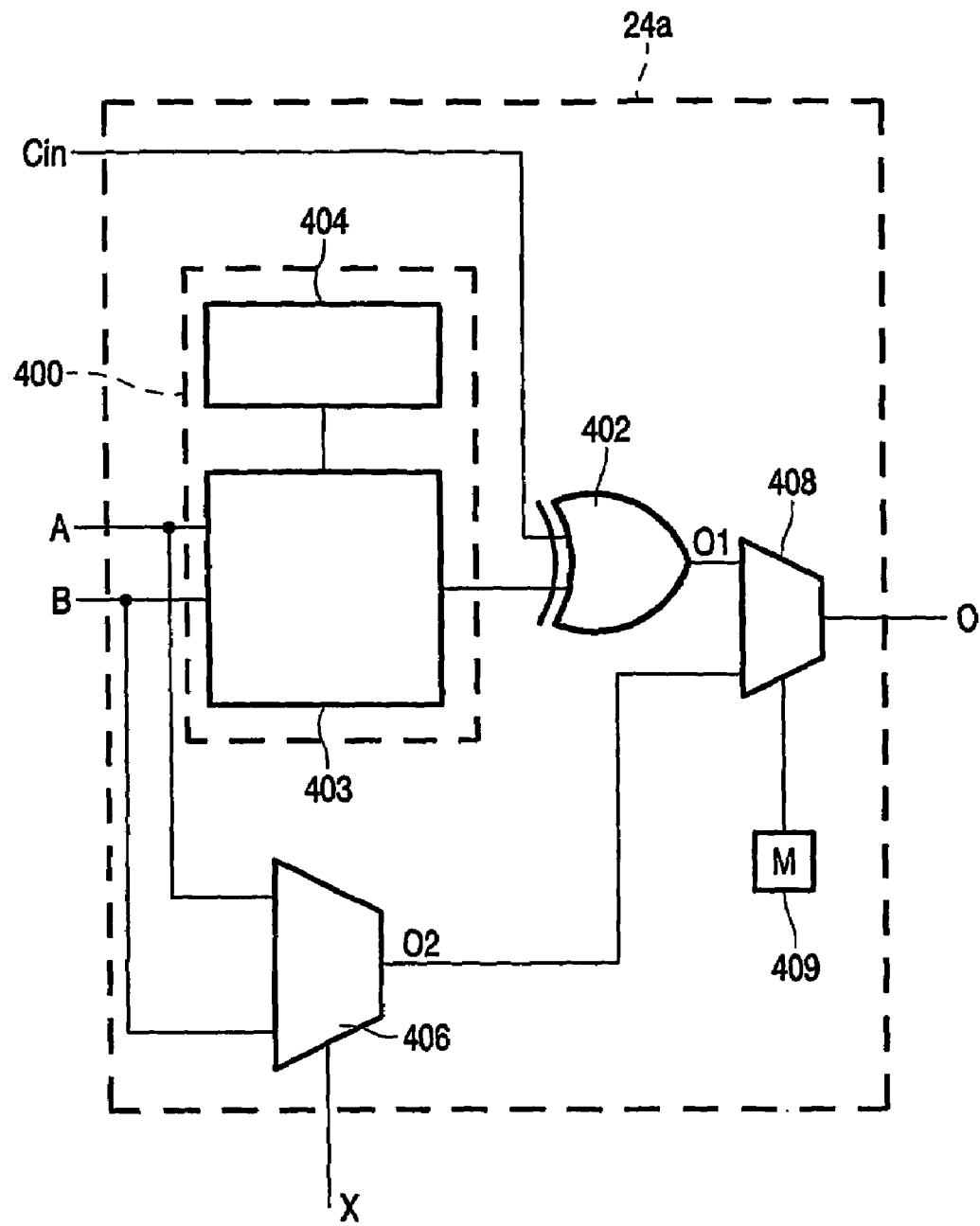
FIG. 3 shows a programmable logic unit according to a first embodiment of the invention.

FIG. 3 shows an embodiment of a programmable logic unit 24 according to the present invention, which enables the logic cell to be configured to provide flexible multiplexing. The programmable logic unit 24 contains a LUT unit 400 and an exclusive-OR gate 402. The LUT unit 400 comprises selection logic 403, for example a 4:1 multiplexer, and a configuration memory 404. The signal inputs A, B of programmable logic unit 24 are coupled to the inputs of the selection logic 403 in the LUT unit 400. An output of the LUT unit 400 is coupled to an input of exclusive-OR gate 402. A second input of exclusive OR-gate 402 is coupled to receive a carry input signal Cin from the carry chain 28, and the first exclusive-OR gate 402 has an output signal O1.

In operation LUT unit 400 realizes a configurable input output function. In response to each possible combination of input signals A, B, the LUT unit 400 outputs a respective output signal that is selected by the input signals. Each combination of input signals has an output signal assigned to it by configuration bits that are stored in configuration memory 404. Four configuration bits are sufficient to provide an output signal for any possible combination of two input signals. Through the action of exclusive-OR gate 402, the output signal of LUT unit 400 is output from the XOR gate 402 when the carry input signal is logic low, while the output signal is output inverted from XOR gate 402 if the carry input signal is logic high. This arrangement enables the programmable logic unit 24 to handle both datapath functions and random logic functions.

According to the invention, the signal inputs A, B of the programmable logic unit 24 are coupled to the inputs of a dedicated multiplexer 406, (for example a 2:1 multiplexer for a 2-bit LUT), which is placed in parallel to the LUT unit 400. The multiplexer 406 is controlled by a control signal X, which is an auxiliary signal of the logic cell. Preferably, each programmable logic unit 24 receives the same control signal X. The multiplexer 406 selects one of the input signals A, B as an output signal O2. The output signal O2 bypasses the LUT unit 400 and the XOR gate 402. The provision of the multiplexer 406 in the programmable logic unit 24 enables the logic cell to be configured for multiplexing operations. Thus, the programmable logic unit 24 produces an output signal O1 from the LUT unit 400 when configured to operate in datapath or random logic modes, and an output signal O2 from the multiplexer 406 when configured to operate as a multiplexer.

Preferably, in order to provide a single output from the programmable logic unit 24, for example when used in the programmable logic cell arrangement shown in FIG. 2, an auxiliary multiplexer 408 is provided in the programmable logic unit 24. The auxiliary multiplexer 408 receives the output signals O1, O2 from the LUT unit 400 and multiplexer 406, respectively. The auxiliary multiplexer 408 selects between signals O1 and O2 to produce an output signal "O". Selection is made using a configuration memory bit 409, such that the output signal O1 is used when the logic cell is configured to operate in a datapath or random logic mode, while the output signal O2 is used when the cell is configured to operate as a multiplexer.

Figure 4:
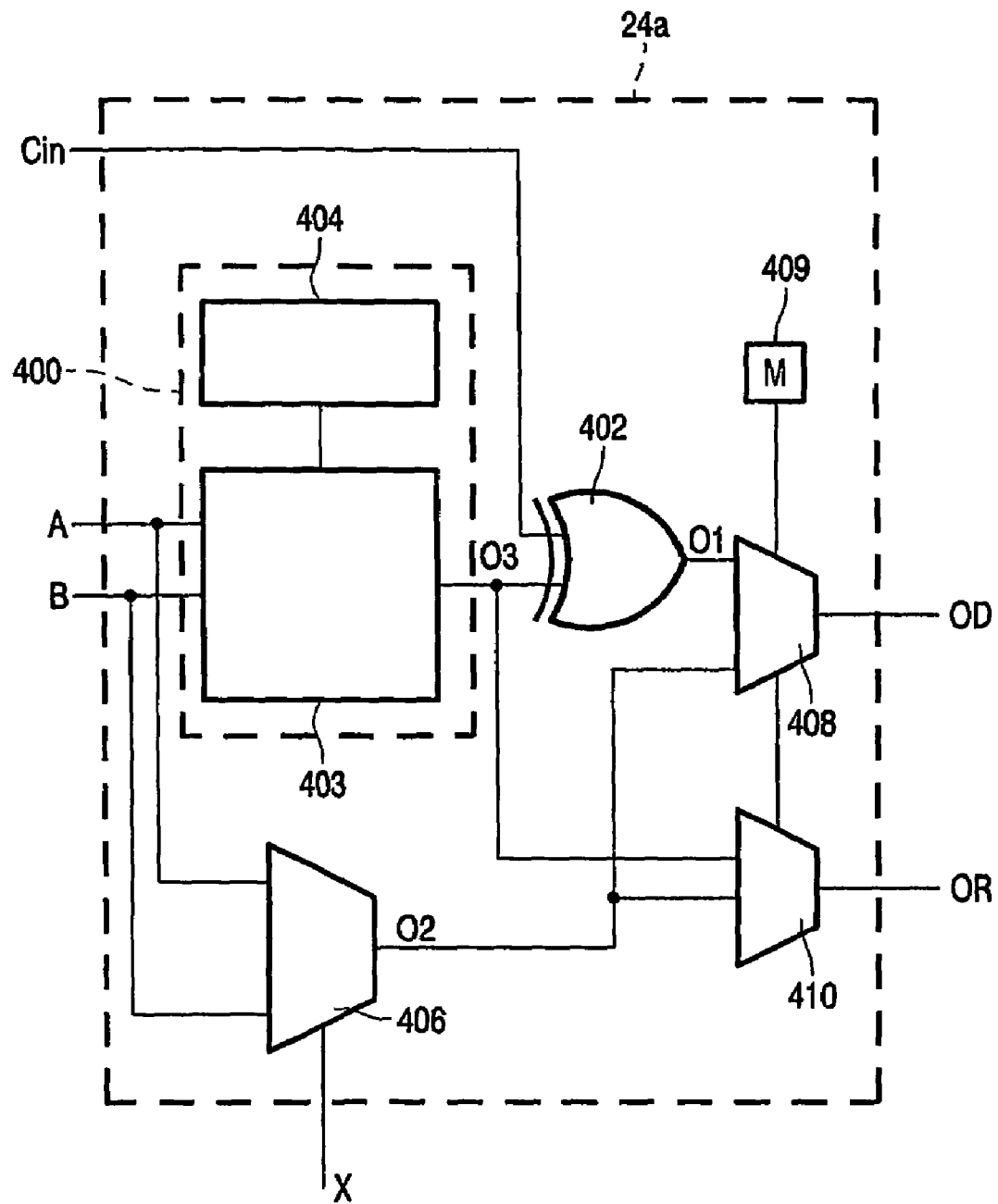
FIG. 4 shows a programmable logic unit according to another embodiment of the invention.

FIG. 4 shows an alternative embodiment of the programmable logic unit 24. In the embodiment of FIG. 4, each programmable logic unit 24 produces not one, but two final output signals. These comprise a datapath output OD and random logic output OR. The datapath output OD of each programmable logic unit 24 is used when the logic cell generates a multi-bit result (i.e. datapath functions), while random logic output OR is used when random logic functions are being mapped. In the embodiment of FIG. 4, two auxiliary multiplexers 408, 410 are provided. As in the first embodiment described in FIG. 3, the first auxiliary multiplexer 408 selects between the output signal O2 from the multiplexer 406 and the output signal O1 from the XOR gate 402. The second auxiliary multiplexer 410 selects between the output signal O2 from the multiplexer 406 and an output signal O3 from the LUT 400, (the signal O3 being the direct output from the LUT 400, which bypasses the XOR gate 402). The first and second auxiliary multiplexers 408, 410 are controlled by a single configuration bit 409. In this arrangement the output signals OD are connected directly to the switching circuit 268, while the output signals OR are connected to the first stage of multiplexers 264a and 264b (see FIGS. 6 and 8 below). In the datapath and random logic modes of operation, the datapath and random logic output signals O1, O3 are made available on the OD and OR outputs, respectively. In the multiplexing mode of operation, the output of the multiplexer O2 is made available at either the OD or OR output, depending upon the particular type of multiplexer being implemented. For example, a 1-bit 8:1 multiplexer will use output signal OR, while a 4-bit 2:1 datapath multiplexer will use the output OD.

The arrangement described above improves the performance of the logic cell when configured to work in the random logic mode, since a direct LUT output O3 is utilized. Furthermore, this arrangement solves the problem of a negative influence of a carry signal on the generation of random logic functions, since the effect of the carry signal on the XOR gate 402 does not influence the random logic output O3.

In practice, two types of multiplexers can be encountered in applications:
random-logic multiplexers which accept a plurality of single-bit inputs and produce a single bit output (for example a 8:1 multiplexer, and
datapath multiplexers which accept a multi-bit input and produce a multi-bit output (for example a 4-bit 2:1 multiplexer).

The logic cell is configurable to provide both types of multiplexers using up to three auxiliary signals, X, Y and Z, in addition to the eight primary input signals. The three auxiliary signals X, Y and Z are used as selection signals for the logic multiplexers mapped onto the logic cell. The three signals are required in order to deal with the maximum case of a 1-bit 8:1 multiplexer. With other multiplexer arrangements fewer auxiliary signals are required.

FIGS. 5 to 8 illustrate example implementations of a random logic 8:1 multiplexer and a datapath 4-bit 2:1 multiplexer for both embodiments of the programmable logic unit shown in FIGS. 3 and 4.

Figure 5:
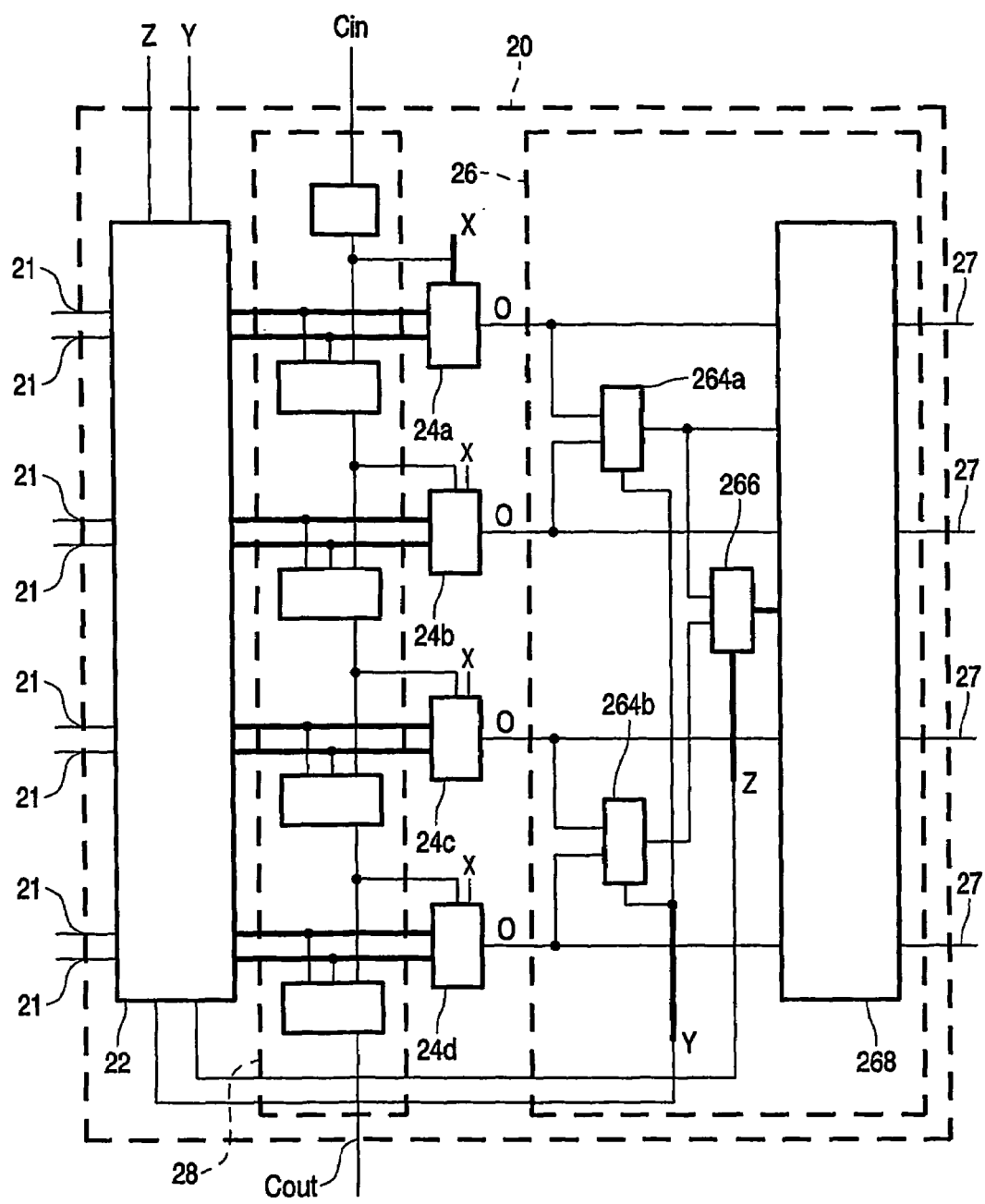
FIG. 5 shows an example implementation of a multiplexer using the programmable logic unit of FIG. 3.

FIG. 5 shows an example configuration of the programmable logic unit 24 of FIG. 3 when used in the logic cell of FIG. 2, and arranged to operate as a 8:1 multiplexer. The output signals O from the programmable logic units 24a–d are connected to the inputs of the first stage of multiplexers 264a and 264b. The first stage of selection from the eight input signals 21 to the four output signals O is carried out by the programmable logic units 24a–d under control of the control signal X. In other words, the selection at this stage is carried out by the multiplexers 406 in each of the programmable logic units 24a–d. The second stage of selection, i.e. between the four output signals O of the programmable logic units 24a–d, is made by the multiplexers 264a, 264b under control of the control signal Y. The final stage of selection is made by the multiplexer 266 under control of control signal Z. Thus, a 8:1 multiplexer configuration is described using the three auxiliary signals X, Y, Z.

Figure 6:
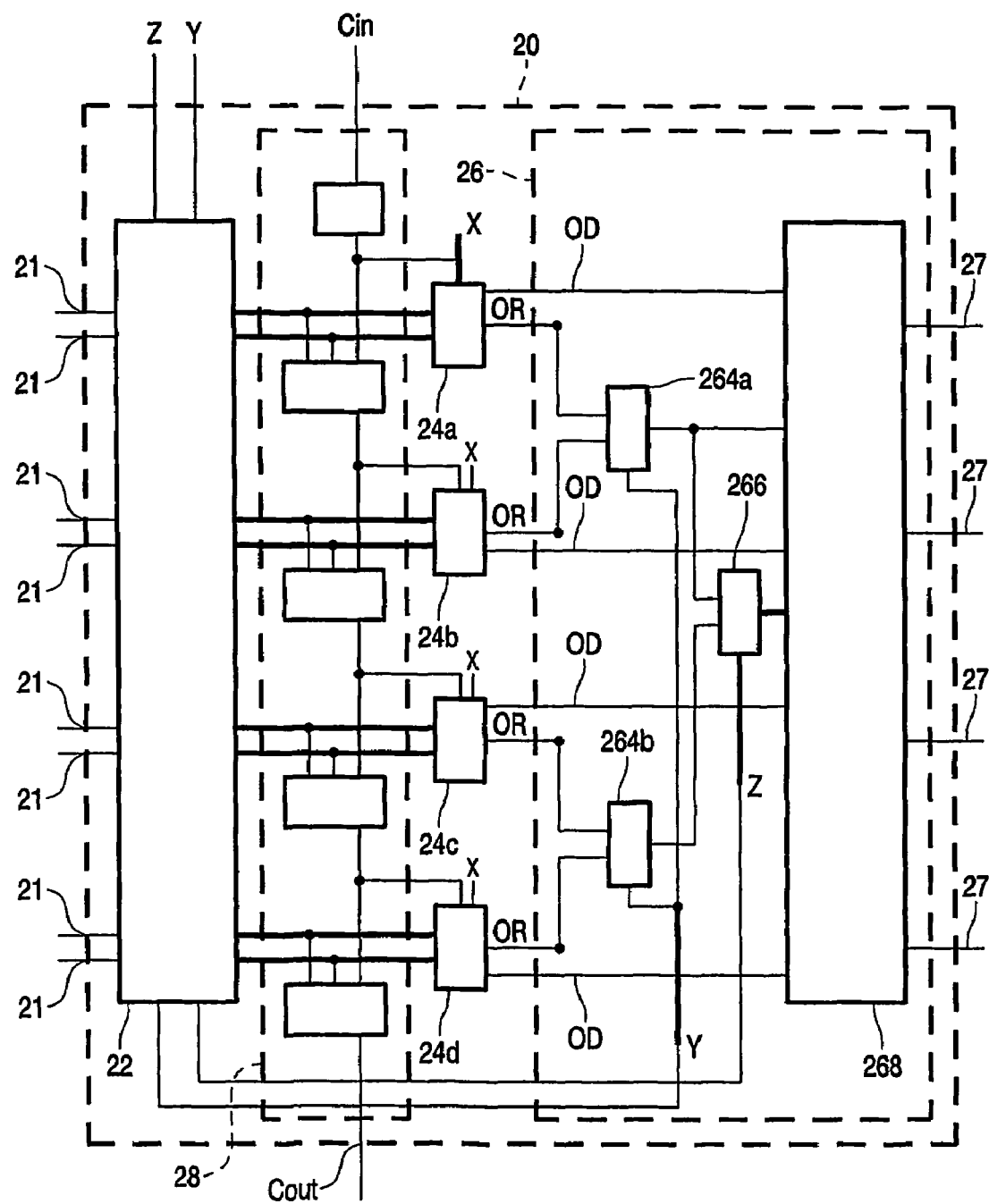
FIG. 6 shows an example implementation of a multiplexer using the programmable logic unit of FIG. 4.

FIG. 6 shows an example configuration of the programmable logic unit 24 of FIG. 4 when used in the logic cell of FIG. 2, and arranged to operate as a 8:1 multiplexer. As can be seen, the output signals OR from each programmable logic unit 24a–d are connected to the inputs of multiplexers 264a and 264b. The outputs OD are connected directly to the switching stage 268. The first stage of selection from the eight input signals to the four output signals OR is carried out in the programmable logic units 24a–d, under control of control signal X. The resulting four output signals OR are connected to the inputs of multiplexers 264a, 264b. The second stage of selection, i.e. between the four output signals OR, is made by the multiplexers 264a, 264b under control of control signal Y. The final stage of selection is made by the multiplexer 266 under control of control signal Z. Thus, as shown in FIG. 5 above, a 8:1 multiplexer configuration is described using three auxiliary signals X, Y, Z.

Figure 7:
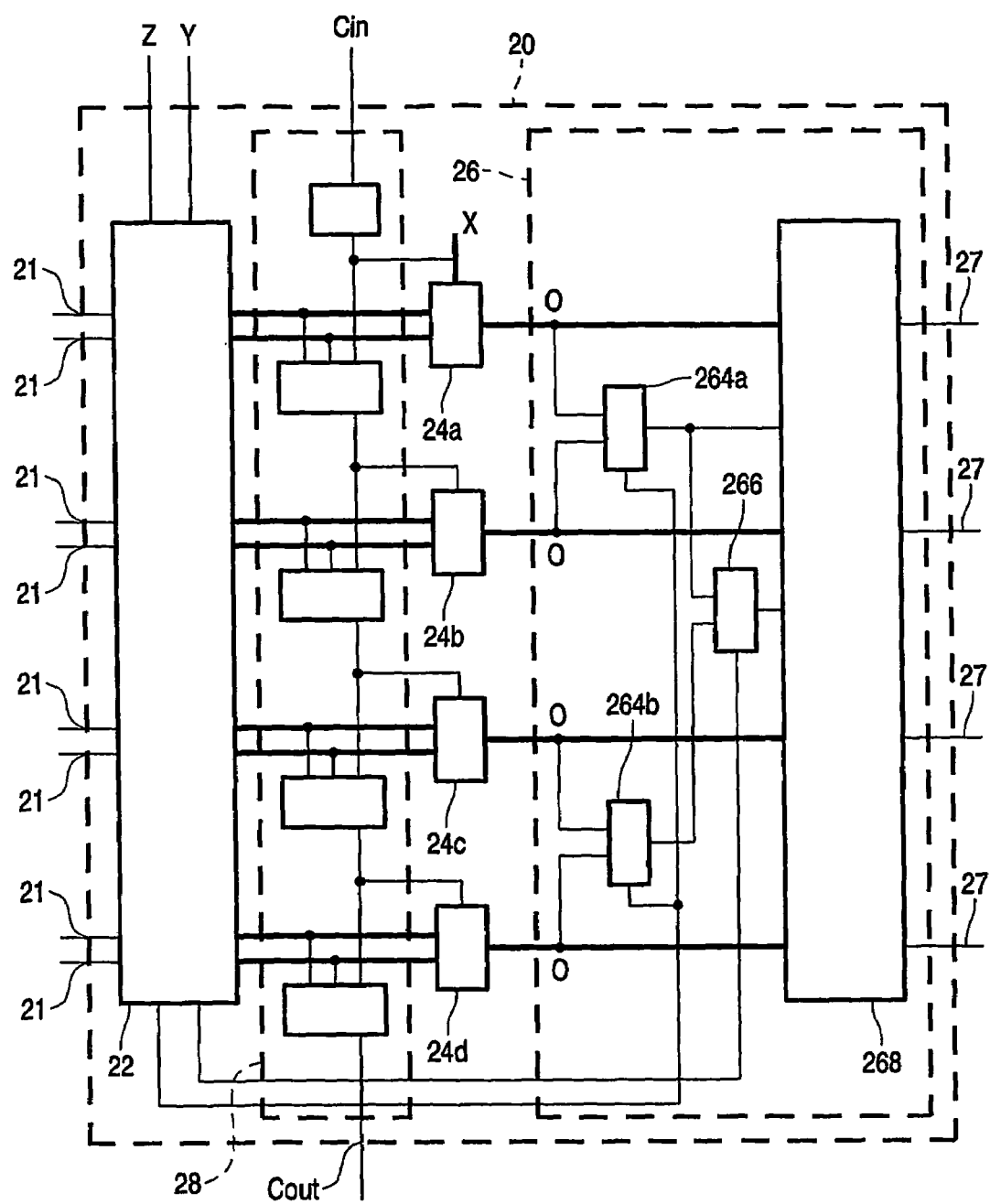
FIG. 7 shows another example implementation of a multiplexer using the programmable logic unit of FIG. 3.

FIG. 7 shows an example configuration of the programmable logic unit 24 of FIG. 3 when used in the logic cell of FIG. 2, and arranged to operate as a datapath 4-bit 2:1 multiplexer. The output signals O from each programmable logic unit 24a–d are connected directly to the switching stage 268. Selection between the two 4-bit input signals is made in the programmable logic units 24a–d using the control signal X. Thus, a datapath 4-bit 2:1 multiplexer is provided using the control signal X.

Figure 8:
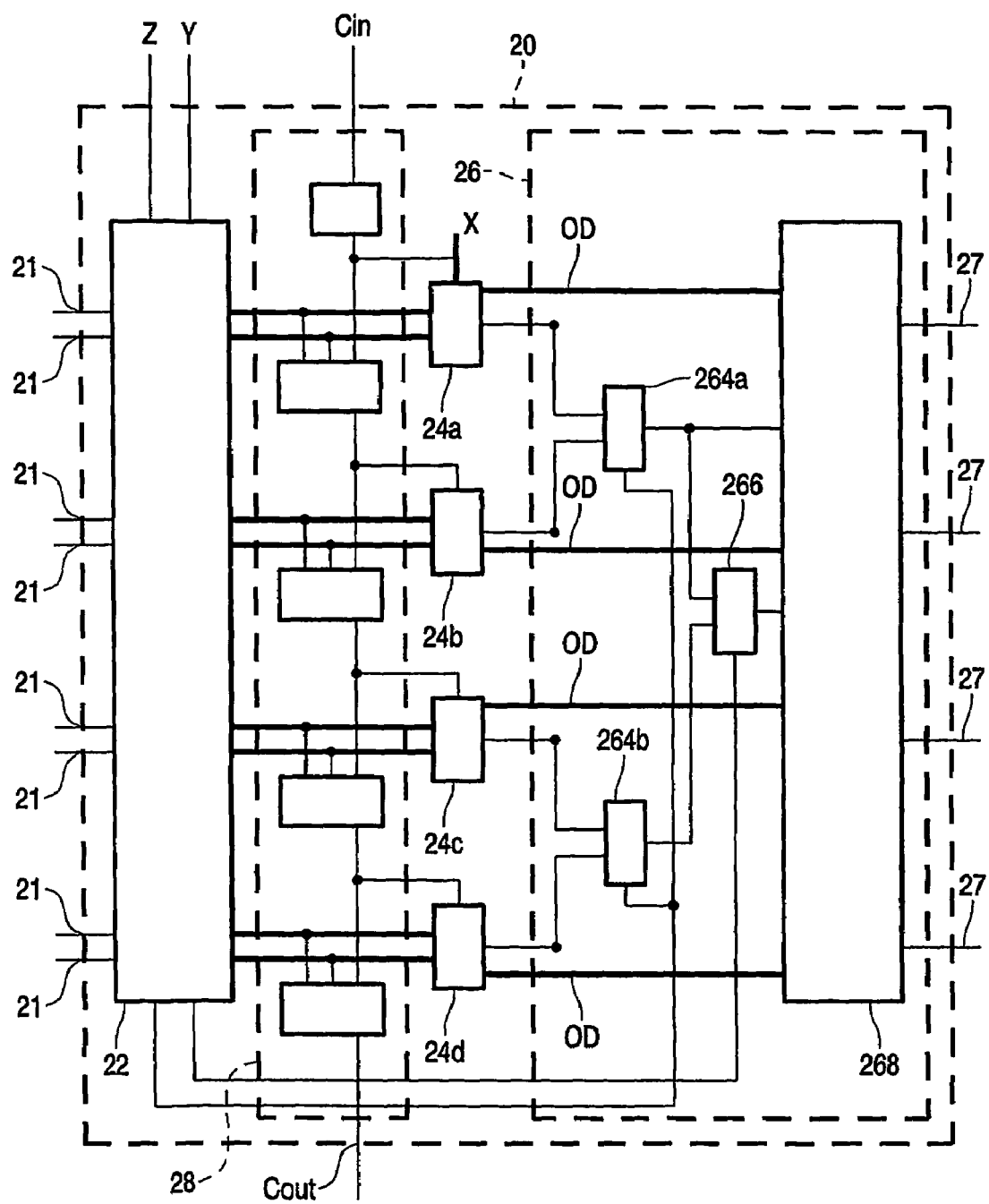
FIG. 8 shows another example implementation of a multiplexer using the programmable logic unit of FIG. 4.

FIG. 8 shows the logic cell of FIG. 2 using a programmable logic unit 24 as described in FIG. 4, and configured to operate as a datapath 4-bit 2:1 multiplexer. The output signals OD from each programmable logic unit 24a–d are connected directly to the switching stage 268. Selection between the two 4-bit input signals is made in the programmable logic units 24a–d using control signal X. Thus, a datapath 4-bit 2:1 multiplexer is provided using the control signal X.

As can be seen from the above, the invention enables a flexible multiplexing arrangement to be configured in an array of programmable logic cells, the programmable logic cells also being capable of handling datapath functions and random logic functions. Although the examples described above relate to a 1-bit 8:1 multiplexer and 4-bit 2:1 multiplexer, it will be readily appreciated by a person skilled in the art that other multiplexing configurations are possible using the logic cell. For example, a 2-bit 4:1 multiplexer can also be implemented in the logic cell. Moreover, although the examples relate to an eight input logic cell, the invention is equally applicable to logic cells having a different number of inputs.

The invention described above provides a logic cell which can be easily configured to a number of multiplexing arrangements, and which is easily adaptable between datapath and random logic functions.

Preferably, the auxiliary control signals X, Y, Z are shared with other input pins used in the datapath mode, for example the carry input (Cin), subtraction (SUB) and multiplication (MUL) signals. Sharing of the input pins in this manner provides an efficient use of control signals as described in greater detail below.

With the programmable logic units of FIG. 3 or 4, an arithmetic addition operation may be implemented by programming the configuration bits of LUT unit 400 to perform an exclusive OR function. Operations other than addition may be implemented by programming LUT unit 400 differently and, of course, addition of a first and second operand is equivalent to subtraction of the complement of the second operand from the first operand, when a logic high carry input signal is used at the lowest significance level.

Figure 9:
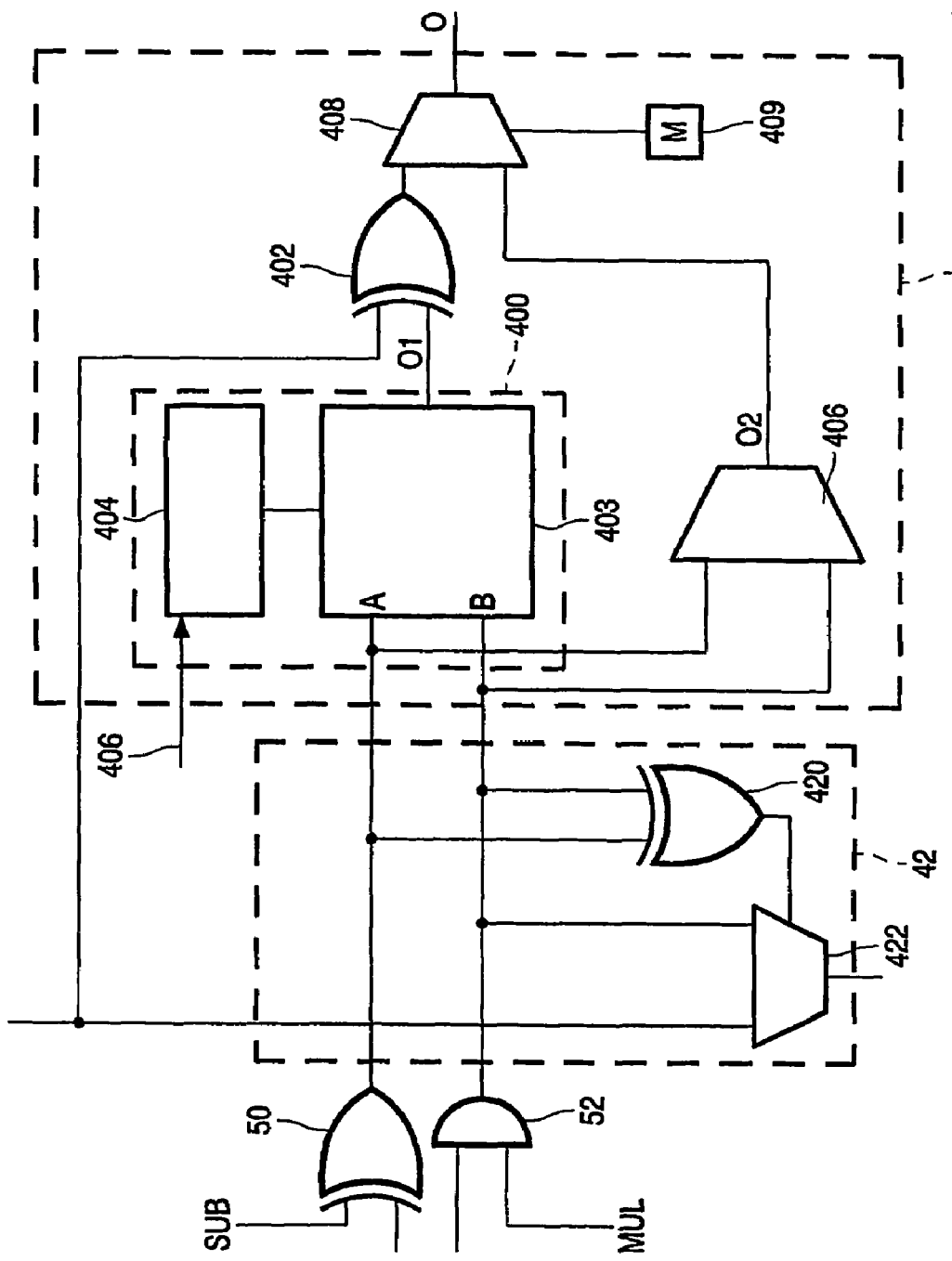
FIG. 9 shows further details of the carry chain with the programmable logic unit of FIG. 3.

FIG. 9 shows the programmable logic unit of FIG. 3 and a part 42 of the carry chain 28. As mentioned previously, programmable logic unit 24 contains a LUT 400 comprising selection logic 403 and a configuration memory 404, plus a first exclusive OR gate 402. The part of the carry chain 42 contains a second exclusive OR gate 420 and a multiplexer 422. The signal inputs A, B of programmable logic unit 24 are coupled to inputs of the second exclusive OR gate 420, which has an output coupled to a control input of multiplexer 422. Multiplexer 422 has inputs coupled to the carry input and to one of the signal inputs of the programmable logic unit 24, respectively. The carry output signal is determined from the carry input signal and the input signals A, B of the programmable logic unit 24. When the input signals are equal (i.e. the output of XOR gate 420 is logic low), multiplexer 422 outputs one of the input signals B as carry output signal. When the input signals A, B are not equal (i.e.

the output of XOR gate 420 is logic high), the multiplexer 422 outputs the carry input signal as carry output signal. As an alternative to the above, since the LUT unit 400 in the datapath mode implements an XOR gate, the dedicated XOR 420 may be removed and the selection signal for the multiplexer 422 provided by the output of the LUT unit 400.

Additional gates 50, 52 enable the programmable logic unit 24 to perform arithmetic subtraction without external complement formation and 1-bit multiplication-plus-accumulation (e.g. as a step in multi-bit multiplication). Implementation of subtraction is facilitated by adding an exclusive OR gate 50 between on one side the LUT unit and second exclusive OR gate and on the other side one of the signal inputs A, B that receives a bit of the operand that must be subtracted. A subtraction control signal SUB is supplied to one of the inputs of exclusive OR gate 50 so that the input signal is logically inverted. The subtraction control signal is set to zero when addition is required. A common subtraction control signal for all of the programmable logic units in cell 20 may be used for this purpose. The subtraction signal may be controlled by a configuration bit of cell 20 or by a signal from outside cell 20. In case of subtraction a logic high carry input signal is applied to the programmable logic unit that is associated with the lowest significance level.

Implementation of multiplication plus accumulation is supported by adding an AND gate 52 between on one side the LUT unit and second exclusive OR gate and on the other side one of the signal inputs A, B that receives a bit of the operand that must be multiplied and supplying a factor signal to one of the inputs of this AND gate. A common factor signal for all of the programmable logic units in cell 20 may be used for this purpose. The factor signal is set to one when addition is required.

Although FIG. 9 shows AND gate 52 and the exclusive OR gate 50 provided in combination, it will be readily apparent to a person skilled in the art that either may be omitted when no subtraction or multiplication is required. Also, it will be understood that multiplication and subtraction can be implemented in alternative ways, with equivalents of exclusive OR gate 50 at different positions in the circuit and/or a different configuration of LUT unit 400. For example, exclusive OR gate 50 may be coupled between an output of the input circuit and the input of carry chain 42, the output of the input circuit being coupled to programmable logic unit 40 without passing through exclusive OR gate 50, provided that the configuration bits in programmable logic unit 40 are adapted to the absence of the effect of exclusive OR gate 50 in case of subtraction. In this case, however, the configuration of programmable logic unit needs to be changed when one switches from addition to subtraction.

Figures 10A, 10B:
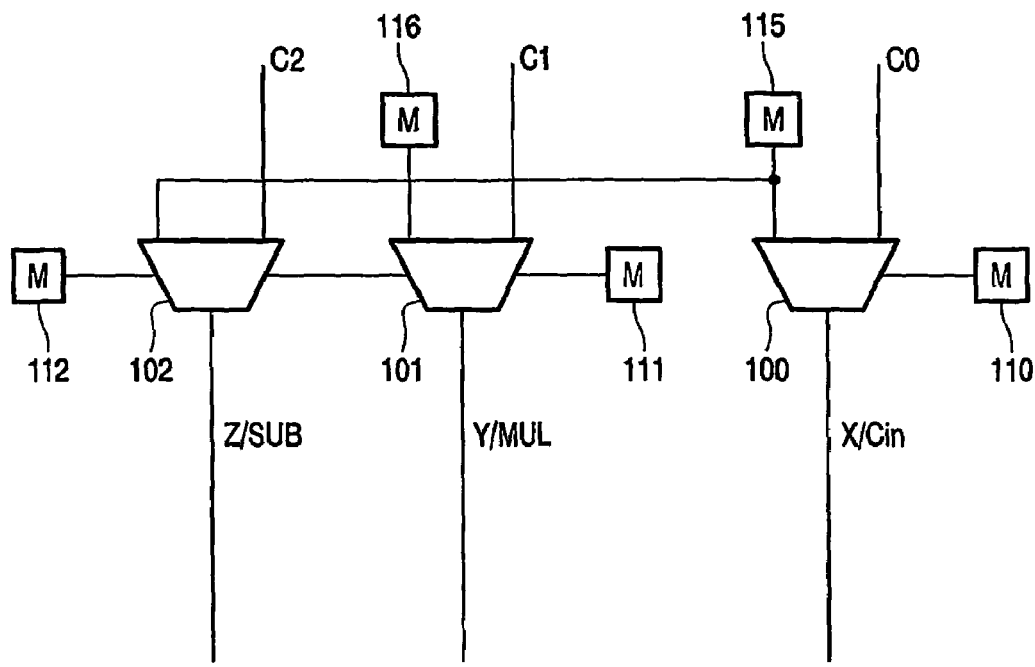
FIG. 10a shows the sharing of input pins between datapath and multiplexer modes.
FIG. 10b shows an example of pin configurations for different modes.

As mentioned above, the auxiliary signals X, Y and Z used in the multiplexing mode can share the same input pins as auxiliary signals Cin, SUB and MUL used in the datapath (arithmetic) mode. FIG. 10a shows as example implementation of pin sharing. Signals from input pins $C_0$, $C_1$, $C_2$ are connected to a first input of multiplexers 100, 101, 102, respectively. Multiplexers 100 and 102 receive a second input set by a configuration bit 115, while multiplexer 101 receives a second input set by a configuration bit 116. Each multiplexer 100, 101, 102 is controlled by an associated configuration bit 110, 111, 112. Each configuration bit 110, 111, 112 controls its respective multiplexer such that the multiplexer selects either the signal from the input pin $C_0$, $C_1$, $C_2$ or a signal having a predetermined logic level, i.e. high/low, set by the configuration bits 115 and 116. In this manner, the control signals X/Cin, Y/MUL and Z/SUB can have dynamic values in which the logic Value is set by external pins $C_0$, $C_1$, $C_2$, or static values set by the configuration bits 115, 116. FIG. 10b shows an example of some modes of configuration that are possible, and the resulting values on control signals X/Cin, Y/MUL, Z/SUB. It is noted that the terms "ext" and "int" refer to circuit configurations with external and internal carry input signals, respectively.

Figure 11:
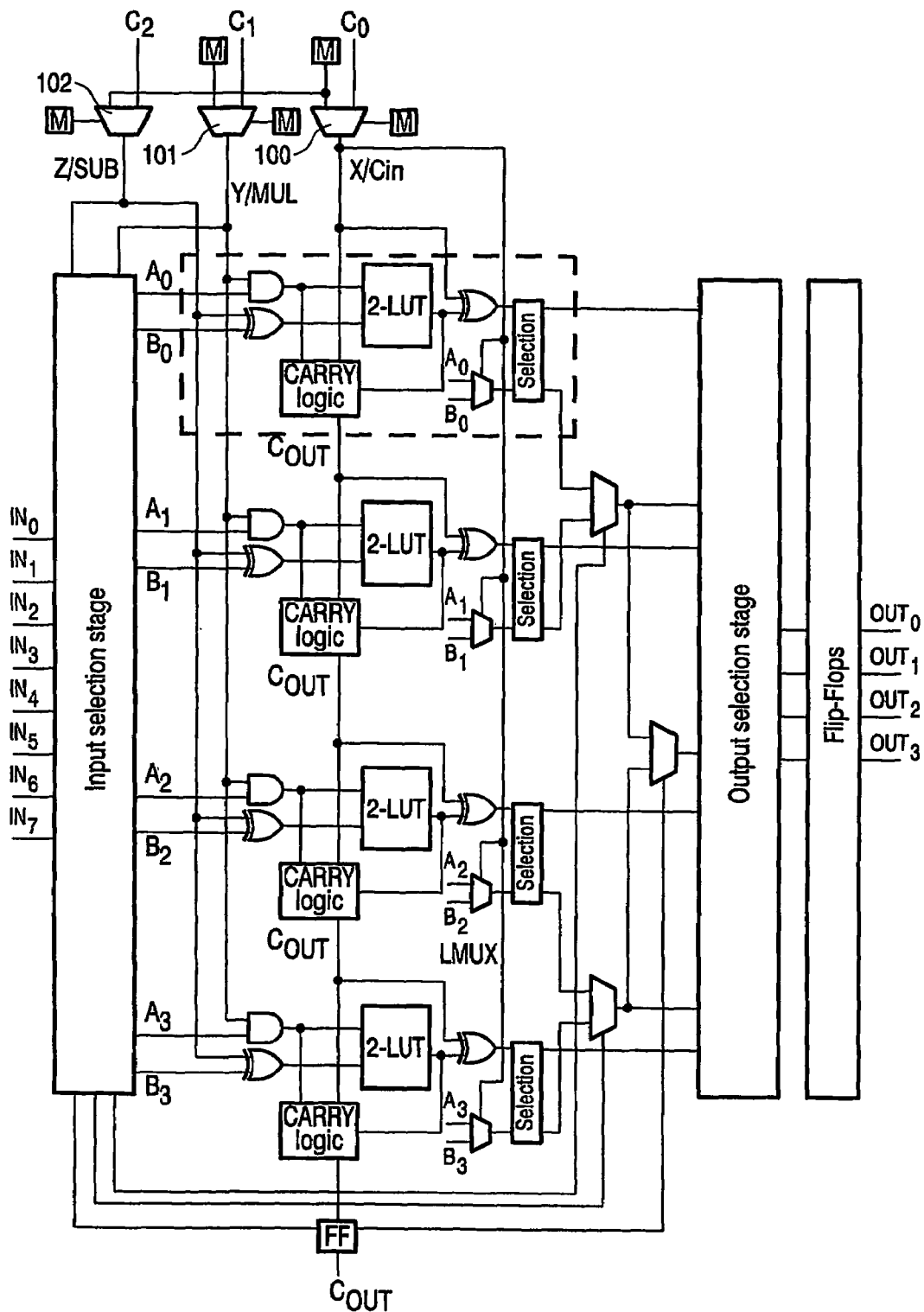
FIG. 11 shows an example implementation of a logic cell having pin sharing as shown in FIGS. 10a and 10b.

FIG. 11 shows an example implementation of a logic cell having pin sharing as described above. Input pin $C_0$ is shared between the control signal X used to control the multiplexers 406a–d and the carry in signal Cin for the carry chain. When configured to operate in a dynamic mode, configuration bit 110 is set such that it selects input pin $C_0$, which will have either the X or Cin signal connected thereto. Alternatively, when configured to operate in a static mode, configuration bit 110 is set such that it selects the input from configuration bit 115, having the X or Cin value set therein. Thus, when operating in a datapath mode, the Cin signal from either the input pin $C_0$ or configuration bit 115 is passed to the input Cin of the carry chain 28. Alternatively, when operating in a multiplexing mode, the control signal X from either the input pin $C_0$ or configuration bit 115 is used to control multiplexers 406a–d. The input pin $C_0$ is therefore shared between the datapath mode and the multiplexing mode, enabling the number of input pins to be reduced.

In a similar manner, input pin $C_1$ is shared between the MUL signal connected to the inputs of AND gates 52a–d in the datapath mode, and control signal Y used to control multiplexers 264a and 264b in the multiplexing modes. When configured to operate in a dynamic mode, configuration bit 111 is set to select input pin $C_1$, which will have either the MUL signal or Y signal connected thereto. Alternatively, when configured to operate in a static, configuration bit 111 is set to select configuration bit 116, which will have either the MUL or Y value stored therein. Thus, when configured to operate in a datapath mode, the MUL signal from either the input pin C, or the configuration bit 116 is used to control the AND gates 52a–d. Also, when configured to operate in a multiplexer mode, control signal Y from either the input pin $C_1$ or the configuration bit 116 is used to control the multiplexers 264a, 264b. The input pin C1 is therefore shared between the datapath mode and the multiplexing mode, thereby reducing the number of input pins required. FIG. 11 shows that the control signals Y for multiplexers 264a and 264b are provided via the input circuit 22. However, it will be appreciated that the output of multiplexer 101 could also be connected directly to the control signal of multiplexers 264a and 264b. It will also be appreciated that the control signals Y can be the same control signal, rather than two separate signals as shown in FIG. 11.

The input pin $C_2$ is shared between the SUB signal connected to the input of XOR gates 50a–d in the datapath mode, and control signal Z used to control multiplexer 266 in the multiplexing mode. When configured to operate in a dynamic mode, configuration bit 112 is set to select input pin $C_2$, which will have either the SUB or Z signal connected thereto. Alternatively, when configured to operate in a static mode, configuration bit 110 is set to select configuration bit 115, which will have either the SUB or Z value stored therein. Thus, when configured to operate in the datapath mode, the SUB signal from either the input pin $C_2$ or the configuration bit 115 is used to control the XOR gates 50a–d. Also, when configured to operate in a multiplexer mode, control signal Z is used to control the multiplexer 266. The input pin $C_2$ is therefore shared between the datapath mode and the multiplexing mode, thereby reducing the number of input pins required. It is noted that, although FIG.

11 shows the control signal Z being connected to the multiplexer 266 via the input circuit 22, the output of multiplexer 102 may also be connected directly to the control signal of multiplexer 266.

The arrangement of FIG. 11 shows how control lines can be shared between the datapath and multiplexing configurations, which means that fewer input pins are required.

Figure 12:
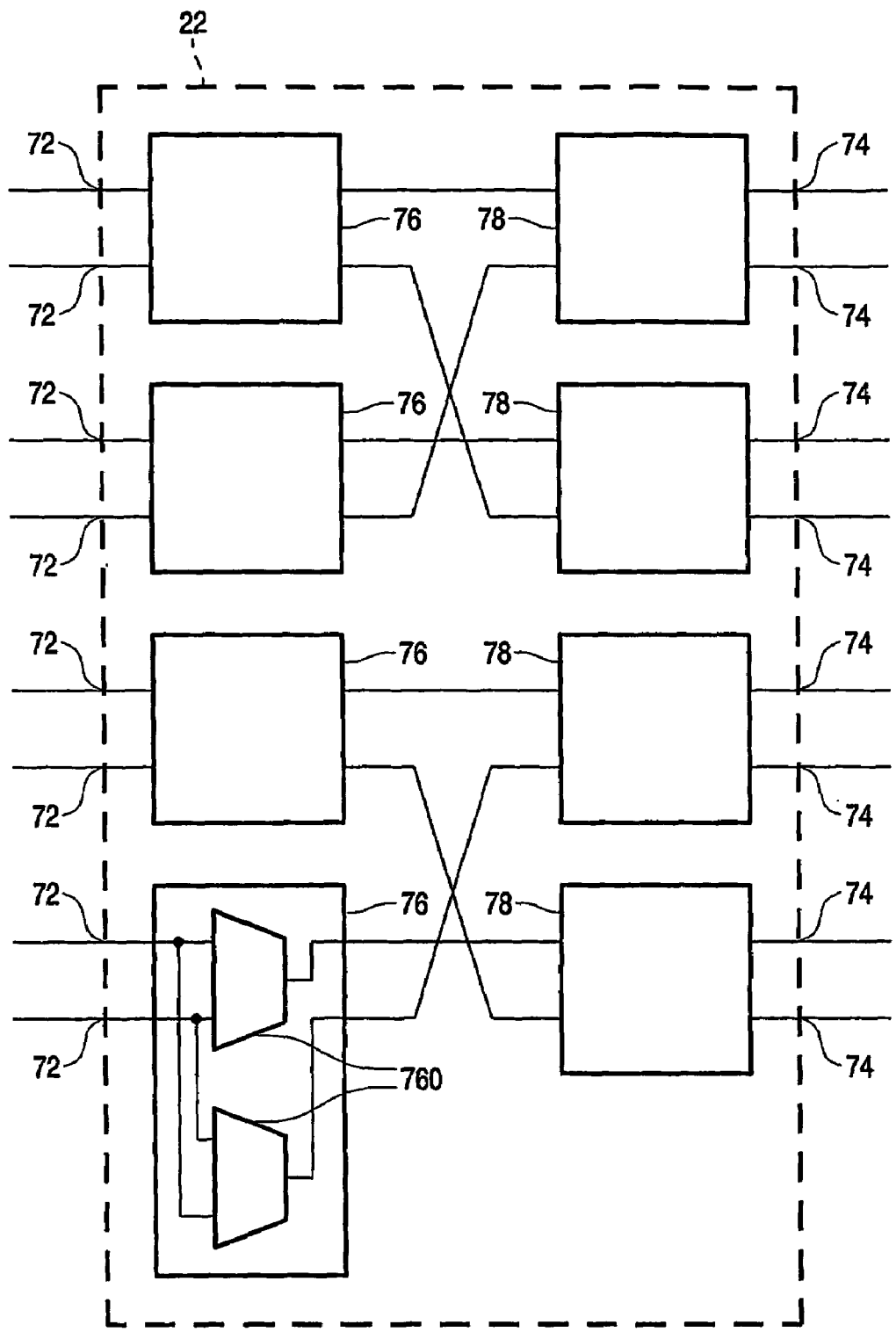
FIG. 12 shows an input circuit.

FIG. 12 shows an input circuit 22. Input circuit 22 has a plurality of inputs 72 coupled to inputs of cell 20 and a plurality of outputs 74 coupled to the inputs of programmable logic units 24a–d and to multiplexers in the output circuit of cell 20. The inputs 72 and outputs 74 are coupled via two layers of switching circuits 76, 78. The switching circuits may be implemented using two multiplexers 760 in each switching circuit 76, 78 (only one shown in detail), each multiplexer 760 providing a configurable coupling between from each input of the switching circuit to a respective one of the outputs. Input circuit 22 also contains third multiplexers (not shown) for selecting input signals that are fed to the multiplexers 264a,b, 266 of the output stage. The operation of switching circuits 76, 78, and the third multiplexers is controlled by configuration bits from configuration memories (not shown).

Both layers 76, 78 are organized as groups of switching circuits 76, 78 each coupling a respective pairs of that inputs to a respective pair of outputs, and are arranged so that the switching circuits 76, 78 in each group are capable of configurably switching between on one hand copying signals from each one of the pair of inputs to both outputs of its pair of outputs, and on the other hand coupling the signals from each input of the pair of inputs to respective ones of the pair of outputs. Layers 76, 78 are combined in series, with outputs from pairs of switching circuits 76 of the first layer being coupled cross-wise to inputs of a pair of different switching circuit 78 in the second layer 78. As a result layers 76, 78 couple quadruplets of inputs 72 to respective quadruplets of outputs 74, and are capable of configurably switching between copying signals from each one of the quadruplet of inputs 72 to all of the outputs in the corresponding quadruplets of outputs 74, and coupling respective ones of the quadruplet of inputs to respective ones of the quadruplet of outputs.

Cell 20 has configuration memories (not shown) coupled to control inputs of switching circuits 76, 78, so that the content of the configuration memories controls switching of the multiplexers of the input circuit. The configuration memories at least select between a random logic mode and a multi-bit operand mode. In the random logic mode switching circuits 76, 78, are controlled to copy signals from two of inputs 72 are copied to inputs of each of the programmable logic units and the third multiplexers (not shown) are controlled to couple signals from other ones of the inputs to control inputs of multiplexers in the output circuit. In the multi-bit operand mode switching circuits 76, 78, are controlled to couple respective ones of inputs 72 to respective ones of outputs 74. In principle, memory for one configuration bit suffices to select between these two modes, but preferably memory for additional configuration bits is provided that select which of the inputs are copied to all of the programmable logic units in the random logic mode. In the latter case, five configuration bits may be used: one configuration bit for selecting between the multi-bit operand mode (one to one signal transfer) and the random logic mode (four times copying) and two times two configuration bits, each for selecting one of four of inputs that is coupled to inputs of each of the programmable logic units.

The third multiplexers (not shown) select the inputs from which signals are fed to the control inputs of the stages of the multiplexers in output circuit 26. Preferably, two third multiplexers are provided, each for selecting an input signal for controlling a respective stage of output circuit 26.

In principle the signal inputs of the cell may be organized into groups of (e.g. four) signal inputs in which each signal input of a group supplies a respective bit of a multi-bit operand that corresponds to the group. To support a random logic mode and a multi-bit operand mode it suffices that the cell has a configuration bit that selects between passing input signals from pairs of groups of logic inputs, each programmable logic unit receiving signals from both groups in the pair, and passing copies of a set of inputs to all programmable logic units. Additional configuration bits may be provided to select the groups or the set.

In this context, a cell with four programmable logic units is especially advantageous, because the number of input signals of random logic functions and the number of bits in multi-bit operands is the same in this case. This means that each group that corresponds to an operand can also be selected as a set of inputs for a random logic function. The configuration bits, if any, for selecting the groups in the multi-bit operand modes may be used to select a group in the random logic mode. In this case a single additional configuration bit suffices for use in the random logic mode, to select which of the groups that would be used as operands in the multi-bit operand mode will be used as set of inputs for the random logic function.

It will be clear that several alternative embodiments of programmable logic unit described in FIG. 3 exist that have the same logic function as described therein. As an alternative, for example, the function of the programmable logic unit 24 of FIG. 3 could be implemented with a three input LUT unit (not shown) that receives the carry signal in addition to the input signals A, B at its inputs and generates a configurable output signal. However, such a LUT unit would need eight configuration bits to be fully programmable. The use of exclusive OR gate 402 to effect carry makes it possible to program both any random two-bit logic function and a signal processing operation that involves a carry with no more than four configuration bits in LUT unit 400.

It will be appreciated that many variations are possible in cell 20 that enable a similar configurability. For example, cells with larger number of two bit input programmable logic units 24a–d may be used, for example with eight such units and with a multiplexer that selects the output of one of these eight programmable logic units under control of three input signals. Thus, 8 bit multi-bit signal processing operations may be used for example.

In addition, it will be appreciated that the XOR gate 402 may be implemented by alternative circuits, such as a 2:1 multiplexer receiving the output of the look-up table at a first input and an inverted version of the output of the look-up table at a second input, the multiplexer being controlled by the carry signal.

The logic cell described above enables a flexible multiplexing arrangement to be configured, in addition to datapath and random logic functions.

The invention claimed is:

1. An electronic circuit with an array of programmable logic cells, each of the cells comprising:
   an input circuit with a plurality of logic inputs;
   an output circuit;
   a plurality of programmable logic units, coupled in parallel between the input circuit and the output circuit, the input circuit being configurable between a random logic mode and a multi-bit operand processing mode, at least one of the programmable logic units comprising:
a configurable look-up table circuit, having inputs coupled to receive the logic input signals from the input circuit and having an output;
a controllable inverter/non-inverter circuit, having an input coupled to receive the output of the look-up table circuit, the output of the inverter/non-inverter circuit being connectable to the output circuit; and
a multiplexer, having inputs coupled to receive the logic input signals from the input circuit, and having a multiplexer output connectable to the output circuit.

2. An electronic circuit as claimed in claim 1, wherein the multiplexer selects an output from amongst the logic input signals on the basis of a first control signal X.

3. An electronic circuit as claimed in claim 1, wherein the programmable logic unit further comprises an auxiliary multiplexer having inputs coupled to receive the output of the inverter/non-inverter circuit and the output of the multiplexer, the output of the auxiliary multiplexer being coupled to the output circuit.

4. An electronic circuit as claimed in claim 3, wherein the auxiliary multiplexer supplies either the output of the inverter/non-inverter circuit or the output of the multiplexer to the output circuit under control of configuration information from a configuration memory.

5. An electronic circuit as claimed in claim 1, wherein the programmable logic unit further comprises:
a first auxiliary multiplexer having inputs coupled to receive the output of the inverter/non-inverter circuit and the output of the multiplexer; and
a second auxiliary multiplexer having inputs coupled to receive the output of the look-up table circuit and the output of the multiplexer;
wherein the first and second multiplexers are controlled by configuration information from a configuration memory, such that datapath and random logic output signals are output from the first and second auxiliary multiplexers respectively in a first mode, and a multiplexer output signal is output from the first and second multiplexers in a second mode.

6. An electronic circuit as claimed in claim 1, wherein the output circuit comprises a first stage of multiplexers for receiving the multiplexer output signals from a plurality of programmable logic units, the first stage of multiplexers being controlled by a second control signal Y.

7. An electronic circuit as claimed in claim 6, wherein the output circuit comprises at least one further stage of multiplexing, the at least one further stage of multiplexing comprising at least one multiplexer configurable to receive the outputs of the multiplexers in the first stage of multiplexers, and providing an output signal under control of a third control signal Z.

8. An electronic circuit as claimed in claim 1, wherein the multiplexer selects an output from amongst the logic input signals on the basis of a first control signal X, the output circuit further comprising:
a first stage of multiplexers for receiving the multiplexer output signals from a plurality of programmable logic units, the first stage of multiplexers controlled by a second control signal Y,
a second stage of multiplexing, the second stage of multiplexing comprising at least one further multiplexer configurable to receive the outputs of the multiplexers in the first stage of multiplexers, and providing an output signal under control of a third control signal Z,
wherein at least one of said first, second and third control signals is usable as an auxiliary control signal when the circuit is configured to operate in a multi-bit operand processing mode.

9. An electronic circuit as claimed in claim 1, further comprising a carry input and a carry output, a carry chain coupled between the carry input, the input circuit and the carry output;
the programmable logic units being coupled to successive positions along the carry chain at least in the multi-bit operand mode, so as to process carry signals from the carry chain, the output circuit selecting an output signal from the programmable logic units under control of further input signals in the random logic mode and passing outputs from the programmable logic units in parallel in the multi-bit operand mode.

10. An electronic circuit as claimed in claim 9, wherein a carry output of the carry chain is coupled to an inversion non-inversion control input of the inverter/non-inverter circuit.

11. An electronic circuit according to claim 1, wherein the cell comprises a subtraction control circuit arranged to control at least a carry output determination operation of the carry chain, the carry chain determining a carry output signal from input signals and carry input signals at each position along the carry chain, control by the subtraction control circuit switching the carry output determination at least between a determination appropriate for addition and determination appropriate for subtraction, under control of a subtraction control signal.

12. An electronic circuit according to claim 1, wherein the cell comprises a respective multiplication circuit for each programmable logic unit, coupled to multiply at least one of the inputs signals of the programmable logic unit with a multiplicand prior to supplying said at least one of the input signals to an input of the programmable logic unit.

13. An electronic circuit according to claim 1, wherein each of the programmable logic units has two unit inputs for signals from the logic inputs, each programmable logic unit being configurable to implement independently any two-input bit logic function of the logic inputs.

14. An electronic circuit according to claim 9, wherein the carry chain circuit has a configurable coupling between said positions and the carry input of the cell, for configurably supplying either a carry input signal to the carry chain or a standard signal, under control of configuration information from a configuration memory.

15. An electronic circuit according to claim 1, wherein the carry chain circuit has a plurality of configurable couplings, each coupled between a respective one of said positions and a respective one of the programmable logic units, for configurably supplying either a carry signal from said position to the programmable logic circuit or a further signal that is not a result of propagation through the carry chain, under control of configuration information from a configuration memory.

16. An electronic circuit according to claim 1, wherein the inverter/non-inverter circuit comprises an exclusive OR circuit.

17. An electronic circuit according to claim 1, wherein the inverter/non-inverter circuit comprises a multiplexer, said multiplexer receiving the output of the look-up table at a first input and an inverted version of the output of the look-up table at a second input, the multiplexer being controlled by a carry signal.

18. An electronic circuit according to claim 1, wherein the input circuit is arranged to be configurable to provide only a proper subset of all possible couplings between the signal inputs of the cell and inputs of the programmable logic units, the subset comprising a multi-bit operand coupling, in which respective ones of the signal inputs are coupled to respective inputs of respective ones of the programmable logic units, and a random logic coupling in which a subset of the signal inputs is coupled to the inputs of each of the programmable logic units.

19. An electronic circuit according to claim 18, wherein the subset comprises a two-bit output random logic coupling in which a first and second subset of the signal inputs are coupled to the inputs of each of a first and second subset of pluralities of the programmable logic units respectively.

20. An electronic circuit according to claim 1, configured to perform a random logic function, wherein each of the programmable logic units is configured to provide a respective input-output relation and logic input signals from the logic inputs select from which of the programmable logic units a logic output signal is passed to a logic output of the output circuit.

21. An electronic circuit according to claim 1, configured to perform a multi-bit operand signal processing function, wherein each of the programmable logic units is configured to provide the same input-output relation subject to a carry input signal from the carry chain, and the output circuits outputs output signals from the programmable logic units in parallel.

* * * * *